United States Patent
Kagoshima et al.

(10) Patent No.: US 8,992,721 B2
(45) Date of Patent: Mar. 31, 2015

(54) PLASMA PROCESSING APPARATUS

(75) Inventors: Akira Kagoshima, Kudamatsu (JP); Daisuke Shiraishi, Hikari (JP); Satomi Inoue, Kudamatsu (JP); Shigeru Nakamoto, Kudamatsu (JP); Shoji Ikuhara, Hikari (JP); Toshihiro Morisawa, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 684 days.

(21) Appl. No.: 12/696,571

(22) Filed: Jan. 29, 2010

(65) Prior Publication Data
US 2011/0083808 A1 Apr. 14, 2011

(30) Foreign Application Priority Data
Oct. 9, 2009 (JP) .................................. 2009-235274

(51) Int. Cl.
*G05B 13/04* (2006.01)
*H01J 37/32* (2006.01)

(52) U.S. Cl.
CPC ..... *H01J 37/32926* (2013.01); *H01J 37/32935* (2013.01); *G05B 13/048* (2013.01); *G05B 2219/31357* (2013.01)
USPC .......................... 156/345.24; 118/712; 438/16

(58) Field of Classification Search
CPC ............. G05B 2219/31357; G05B 13/048; H01L 21/67276; H01J 37/32926
USPC ............ 156/345.24–345.28; 438/14–16; 257/E21.525, E21.528, E21.529; 118/712
See application file for complete search history.

(56) References Cited

U.S. PATENT DOCUMENTS 6,587,744 B1 * 7/2003 Stoddard et al. .............. 700/121
2003/0003607 A1 * 1/2003 Kagoshima et al. ............ 438/14

(Continued)

FOREIGN PATENT DOCUMENTS

JP 2003-017471 1/2003
JP 2005-038976 2/2005

(Continued)

OTHER PUBLICATIONS

Japanese Office Action dated Mar. 21, 2013 for Application No. 2009-235274.

(Continued)

*Primary Examiner* — Jeffrie R Lund
*Assistant Examiner* — Yuechuan Yu
(74) *Attorney, Agent, or Firm* — Baker Botts L.L.P.

(57) ABSTRACT

A plasma processing apparatus including: a monitor device which monitors a process quantity generated at plasma processing; a monitor value estimation unit which has monitor quantity variation models for storing change of a monitor value of the process quantity in accordance with the number of processed specimens and which estimates a monitor value for a process of a next specimen by referring to the monitor quantity variation models; and a control quantity calculation unit which stores a relation between a control quantity for controlling the process quantity of the vacuum processing device and a monitor value and which calculates the control quantity based on a deviation of the estimated monitor value from a target value to thereby control the process quantity for the process of the next specimen. Thus, a process model indicating variation of the state of a process processing apparatus can be added to a control loop in such run-to-run control that process conditions are changed according to each wafer process, so that stable processed results can be obtained even when variation occurs in processes.

9 Claims, 11 Drawing Sheets

(56) References Cited

U.S. PATENT DOCUMENTS

| | | | |
|---|---|---|---|
| 2003/0045009 A1* | 3/2003 | Tanaka et al. | 438/8 |
| 2005/0016682 A1 | 1/2005 | Nagatomo et al. | |
| 2005/0158886 A1* | 7/2005 | Tanaka et al. | 438/8 |
| 2006/0287754 A1* | 12/2006 | Sugamoto et al. | 700/121 |

FOREIGN PATENT DOCUMENTS

| | | |
|---|---|---|
| JP | 2006-013013 | 1/2006 |
| JP | 2006-072791 | 3/2006 |
| JP | 2006-074067 | 3/2006 |
| JP | 2012-212894 | 11/2012 |
| TW | 200849325 | 2/1997 |
| TW | 200929340 | 7/2009 |
| WO | WO 2009/055431 | 4/2009 |

OTHER PUBLICATIONS

Office Action issued in Taiwanese Patent Application on May 22, 2013.

* cited by examiner

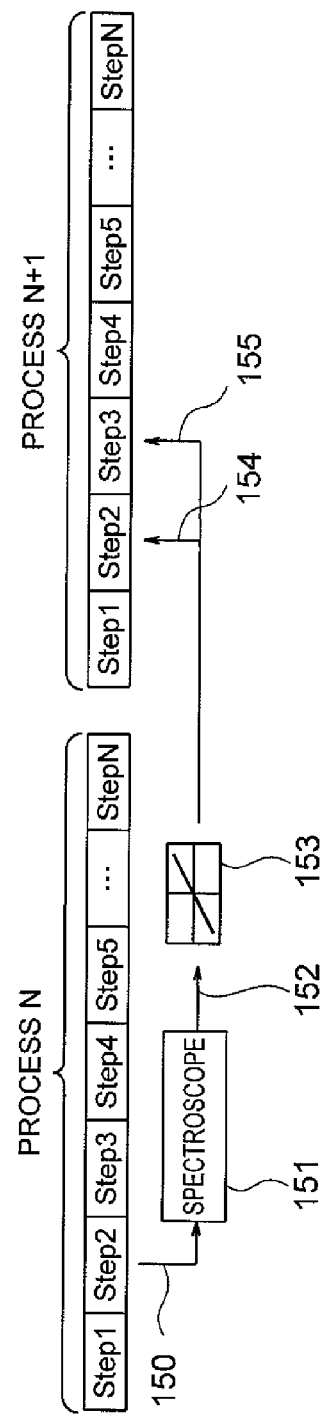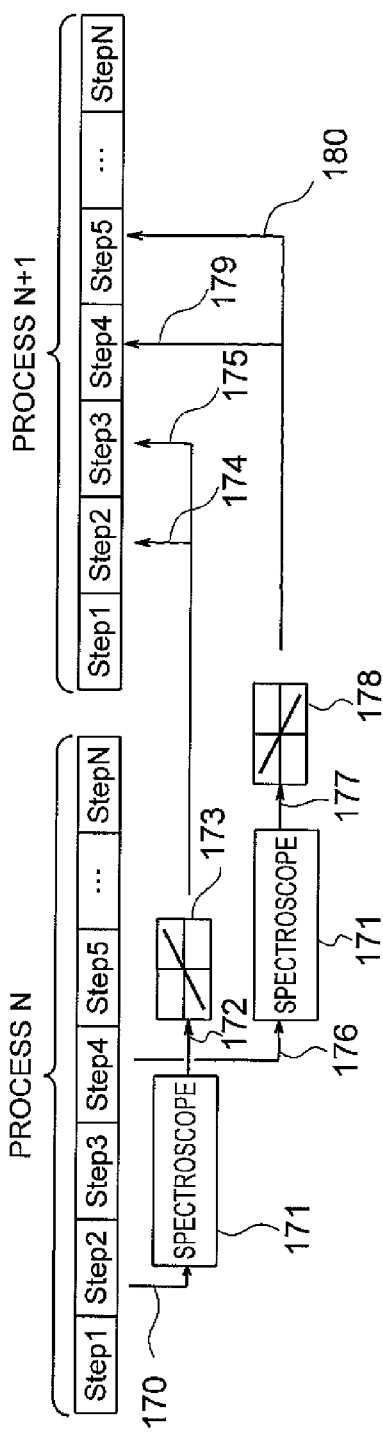
FIG. 11A
FIG. 11B

PLASMA PROCESSING APPARATUS

BACKGROUND OF THE INVENTION

1. Field of the Invention

The present invention relates to a plasma processing apparatus. Particularly, it relates to a plasma processing apparatus which can suppress an influence caused by change of a process condition occurring with the progress of plasma processing.

2. Description of the Background Art

For example, the plasma processing apparatus is an apparatus for importing an etching gas into a vacuum process chamber, generating plasma discharge in the imported etching gas under a reduced pressure to thereby generate radicals or ions, and inducing the radicals or ions to a surface of a wafer as a subject of processing to make the radicals or ions react with the surface of the wafer to thereby etch the surface of the wafer.

With the advance of reduction in size of a produced device, such a plasma processing apparatus might not be able to obtain desired performance because of various disturbances even when a predetermined recipe was used for processing. Therefore, run-to-run control capable of suppressing an influence caused by various disturbances has been used. Run-to-run control is a technique for changing a recipe as a production condition in accordance with each wafer or lot to be processed so that an influence caused by change of process conditions can be suppressed.

For example, JP-A-2003-17471 has disclosed a plasma processing apparatus for processing a specimen contained in a vacuum process chamber, which includes a sensor for monitoring a process quantity during processing, a processed result estimation model for estimating a processed result, and an optimum recipe calculation model for calculating an optimum recipe based on the result estimated by the processed result estimation model, wherein plasma processing is controlled based on the recipe generated by the optimum recipe calculation model.

On the other hand, JP-A-2006-72791 has disclosed a model predictive control apparatus for predicting a subject of control by using control subject models and evaluating the prediction to perform optimum control on the subject of control, which includes control subject models with different sampling periods, wherein one of the control subject models is selected in accordance with change of the sampling period so that both shortening of arithmetic processing time and securement of prediction accuracy can be achieved.

In a plasma etching apparatus, an etching process is generally performed based on a predetermined process condition called recipe. Etching performance (etching rate, etching size, etc.) however often varies in accordance with change of the state of a reaction product deposited on an inner wall or the like of a process chamber, the wear-out degree of each component, etc. To reduce such variations, run-to-run control for changing the process condition in accordance with each wafer to be processed may be used as described above.

Etching rate and processing size are indices for judging whether the result processed by the etching apparatus is good or not. It is however necessary to convey the wafer to an inspection device for measuring the etching rate or processing size. For this reason, a unit capable of evaluating the processed result (performance result) immediately after processing is required for achieving run-to-run control in accordance with each wafer to be processed.

Assume now that the performance result is not directly measured but indirectly measured based on data which can be monitored during processing such as plasma light emission. When, for example, the relation between a monitor value and a performance result is formed as a model in advance, the model can be referred to so that the monitor value can be used in place of the performance result.

Incidentally, for achievement of such run-to-run control, it is necessary to generate a control model by modeling the relation between a process monitor value clearly associated with a processed result obtained in accordance with each wafer to be processed and a control variable capable of controlling the process monitor value.

FIG. 2 is a graph of a control model generated by modeling the relation between a monitor value of plasma light emission during an etching process and a gas flow rate as a process condition. This model shows the relation between the flow rate of an oxygen gas as a gas imported during the etching process and the light emission intensity of a wavelength indicating oxygen as the monitor value of plasma light emission intensity obtained during the process.

In FIG. 2, the reference numeral 1 designates a value which indicates plasma light emission intensity when the process (etching process) is executed without any trouble and which is a target value for run-to-run control. That is, when plasma light emission intensity takes the target value 1, for example, the processing size as an etching performance result is a desired size.

On the other hand, when plasma light emission during the process takes a larger value or a smaller value than the target value 1, the etching performance result is not a desired value because the value of plasma light emission indicates some change of the process condition.

Run-to-run control operates to bring the performance result close to a target value when the performance result is likely to go out of the desired value. That is, in run-to-run control, control quantity for a next process (e.g. next wafer process) is calculated based on a difference between the obtained process monitor value and the target value 1 and a process condition (recipe) for the next process is corrected based on the calculated control quantity so that the process is executed in the corrected process condition.

FIG. 3 is a graph showing plasma light emission intensity obtained by execution of run-to-run control using the aforementioned control model when values of the plasma light emission intensity are plotted in accordance with wafer processes. In FIG. 3, the reference numeral 2 designates a time point that a product lot to be processed is changed.

In this example, plasma light emission intensity is designed to converge at the target value 1 by run-to-run control. There may be however the case where it impossible to perform control to make the plasma light emission intensity coincident with the target value 1. In practice, the plasma light emission intensity is controlled with some variation 3 as shown in the example of FIG. 3. Because this variation means that the performance result varies, this variation exerts an influence on performance of produced products. Such a variation is caused by the fact that the control model cannot reflect all process conditions occurring in the process chamber.

Incidentally, the example disclosed in JP-A-2003-17471 cannot be applied to such a long-term process change that the process condition changes in a lot or between lots. In addition, in the example disclosed in JP-A-2006-72791, the control subject models with different sampling periods cannot be applied to such a process that the process condition changes in accordance with each term (in a lot or between lots).

The invention is accomplished in consideration of the aforementioned problems. An object of the invention is to provide a plasma processing apparatus which can execute run-to-run control in which the process condition of the apparatus is reflected, and which can obtain stable performance results.

SUMMARY OF THE INVENTION

To solve the aforementioned problems, the invention uses the following means.

A plasma processing apparatus for generating plasma in a vacuum processing device and applying plasma processing to specimens disposed in the vacuum processing device by use of the generated plasma, including: a monitor device which monitors a process quantity generated at plasma processing; a monitor value estimation unit which has at least one monitor quantity variation model for storing change of a monitor value of the process quantity in accordance with the number of processed specimens and which estimates a monitor value for a next process by referring to the monitor quantity variation model; and a control quantity calculation unit which stores a control model indicating a relation between a control quantity for controlling the process quantity of the vacuum processing device and a monitor value and which calculates the control quantity based on a deviation of the estimated monitor value for the next process from a target value to thereby control the process quantity.

With the aforementioned configuration, the invention can provide a plasma processing apparatus which can execute run-to-run control in which the process condition of the apparatus is reflected, and which can obtain stable performance results.

BRIEF DESCRIPTION OF THE DRAWINGS

FIGS. 11A and 11B are views for explaining forms of run-to-run control;

DETAILED DESCRIPTION OF THE INVENTION

An embodiment of the invention will be described below with reference to the accompanying drawings. Although an aim in modeling process conditions will be described first while a plasma etching apparatus is taken as an example, the invention can be applied to any processing apparatus using plasma, such as a plasma CVD apparatus.

Figure 4:
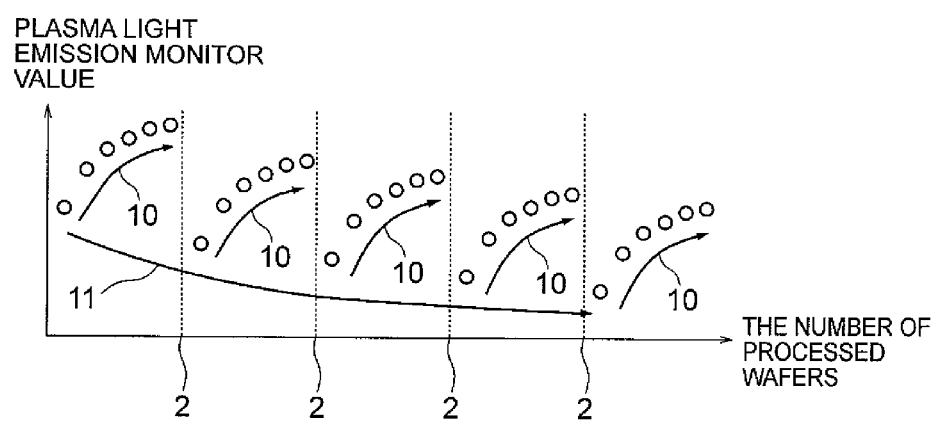
FIG. 4 is a graph showing a trend of plasma light emission intensity without execution of run-to-run control.

FIG. 4 is a graph showing an example of observation of a trend of plasma light emission intensity without execution of run-to-run control. In FIG. 4, the horizontal axis shows the number of processed wafers, and the vertical axis shows a plasma light emission monitor value. In FIG. 4, each separating line 2 shows change of a product lot to be processed. Incidentally, the plasma light emission monitor value is an indicator for indicating etching performance.

Referring to FIG. 4, it is found that there are a pattern 10 in which the monitor value increases in accordance with the change of each lot, and a pattern 11 in which the monitor value decreases totally.

First, the increasing pattern 10 is repeated in accordance with each separating line 2. Although the separating line 2 is a line indicating change of a lot, the separating line 2 is a unit for performing trial running of a process chamber called aging or plasma cleaning for cleaning the chamber with plasma in terms of process.

That is, when a wafer process is repeated, the internal state of the chamber such as the state or temperature of an inner wall of the chamber varies according to each process, so that a process environment changes. The change of the environment results in change of plasma light emission intensity. When aging or plasma cleaning is executed, the state of the process chamber is restored to a state close to the initial state and the chamber environment is reflected on plasma light emission intensity so that the plasma light emission intensity is restored to a state close to the initial state.

By repeating this, each pattern 10 of plasma light emission intensity appears.

There is however the case where the state of the chamber cannot be restored to the original state perfectly by aging or plasma cleaning executed in accordance with each lot. Deviations from the original state are exhibited in the pattern 11.

The state of the chamber can be however restored to the initial state when cleaning of the process chamber opened to the atmospheric air, called wet cleaning, is executed. That is, the pattern 11 is repeated in accordance with the wet cleaning.

Although the shapes of patterns are shown here as an example, patterns may have various forms in accordance with the subject of processing, the process condition, the apparatus, etc. That is, the patterns can be reworded as process models. Accordingly, one of the patterns 10 and 11 is referred to as "short-term variation model" because the pattern 10 appears in a relatively short term, while the other pattern 11 is referred to as "long-term variation model" because the pattern 11 appears in a relatively long term.

Incidentally, consideration of only the short-term model or consideration of only the long-term model may be required in accordance with the process.

In the background art, only one control model indicating the relation between a process monitor value and a control variable was applied to a control loop to execute run-to-run control. Some process condition was however impossible to express only in the control model. As a result, the control varied. It is therefore apparent that more stable control than the control according to the background art can be achieved if control is executed while the aforementioned long-term and short-term variation models are considered in addition to the control model.

Figure 5:
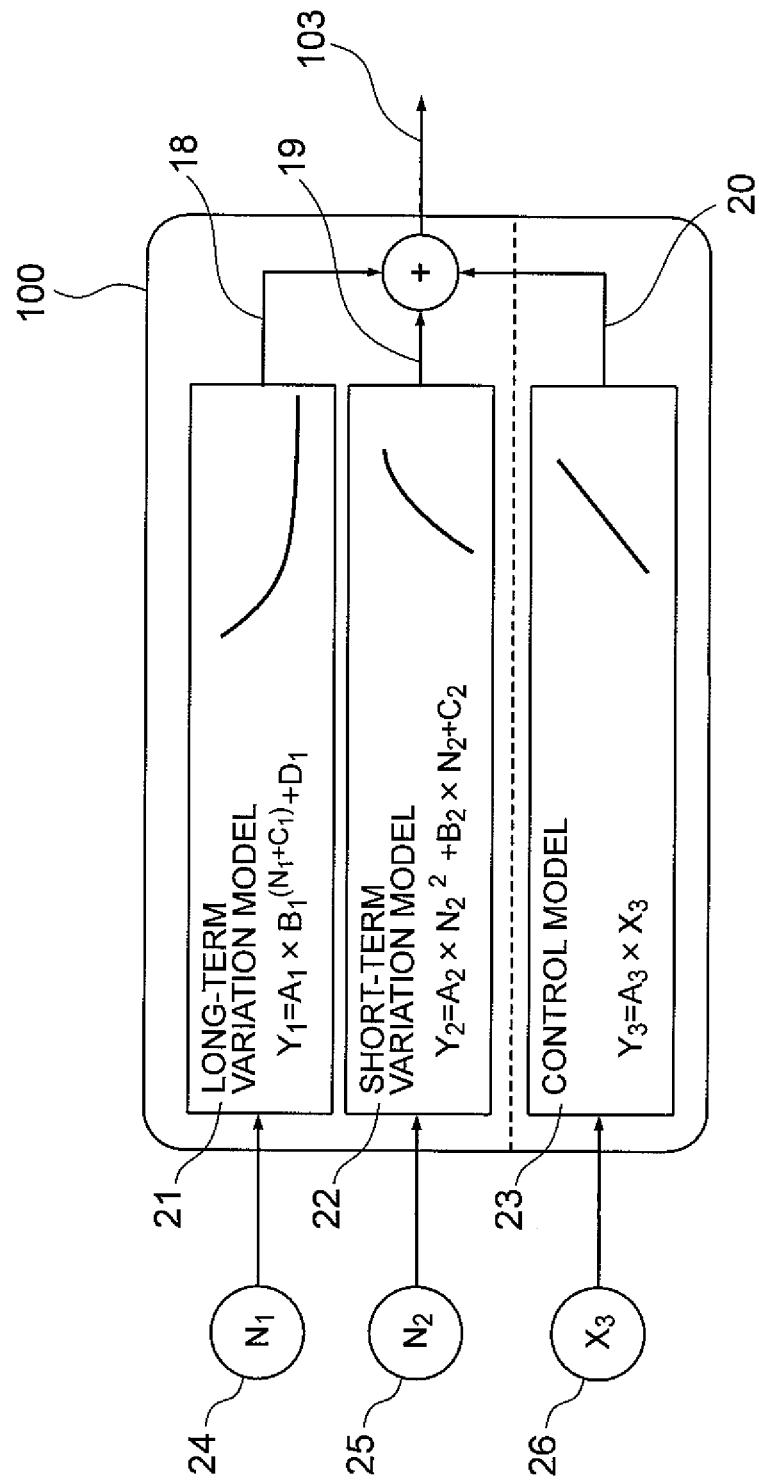
FIG. 5 is a view for explaining an example of a process model obtained by combining a long-term variation model, a short-term variation model and a control model.

FIG. 5 is a view for explaining an example of a process model obtained by combining a long-term variation model, a short-term variation model and a control model.

The process model indicating the process behavior of the inside of a process chamber 100 at the time of execution of run-to-run control is a model obtained by combining a long-term variation model 21, a short-term variation model 22 and a control model 23.

The long-term variation model 21 receives as an input a number 24 ($N_1$) of processed wafers from wet cleaning and outputs a plasma light emission monitor value 18. For example, the long-term variation model 21 can be given as a model represented by the expression 1:

$$Y_1 = A_1 \times B_1^{(N_1+C_1)} + D_1 \qquad (1)$$

in which $Y_1$ is the process monitor value (e.g. plasma light emission monitor value), $N_1$ is the number of processed wafers from wet cleaning, and $A_1$, $B_1$, $C_1$ and $D_1$ are long-term variation model coefficients.

Although description has been made here in the case where $N_1$ is the number of processed wafers from wet cleaning, a process for resetting the long-term variation model may be provided so as to be regarded as a starting point so that $N_1$ is the number of processed wafers from the resetting process.

The short-term variation model 22 receives as an input a number 25 ($N_2$) of processed wafers in a lot and outputs a plasma light emission monitor value 19. For example, the short-term variation model 22 can be given as a model represented by the expression 2:

$$Y_2 = A_2 \times N_2^2 + B_2 \times N_2 + C_2 \qquad (2)$$

in which $Y_2$ is the process monitor value (e.g. plasma light emission monitor value), $N_2$ is the number of processed wafers in a lot, and $A_2$, $B_2$ and $C_2$ are short-term variation model coefficients.

The control model 23 receives as an input a gas change quantity 26 ($X_3$) and outputs a plasma light emission monitor value 20. For example, the control model 23 can be given as a model represented by the expression 3:

$$Y_3 = A_3 \times X_3 \qquad (3)$$

in which $Y_3$ is the process monitor value (e.g. plasma light emission monitor value), $X_3$ is a control quantity, and $A_3$ is a control model coefficient.

An output 103 of the process chamber 100 is expressed as a combination of the outputs 18, 19 and 20 of the respective models.

As described above, because the internal state of the process chamber can be expressed by a combination of the models, an apparatus capable of controlling a process stably can be achieved if a control system is constructed in accordance with the combination of the models.

Figure 1:
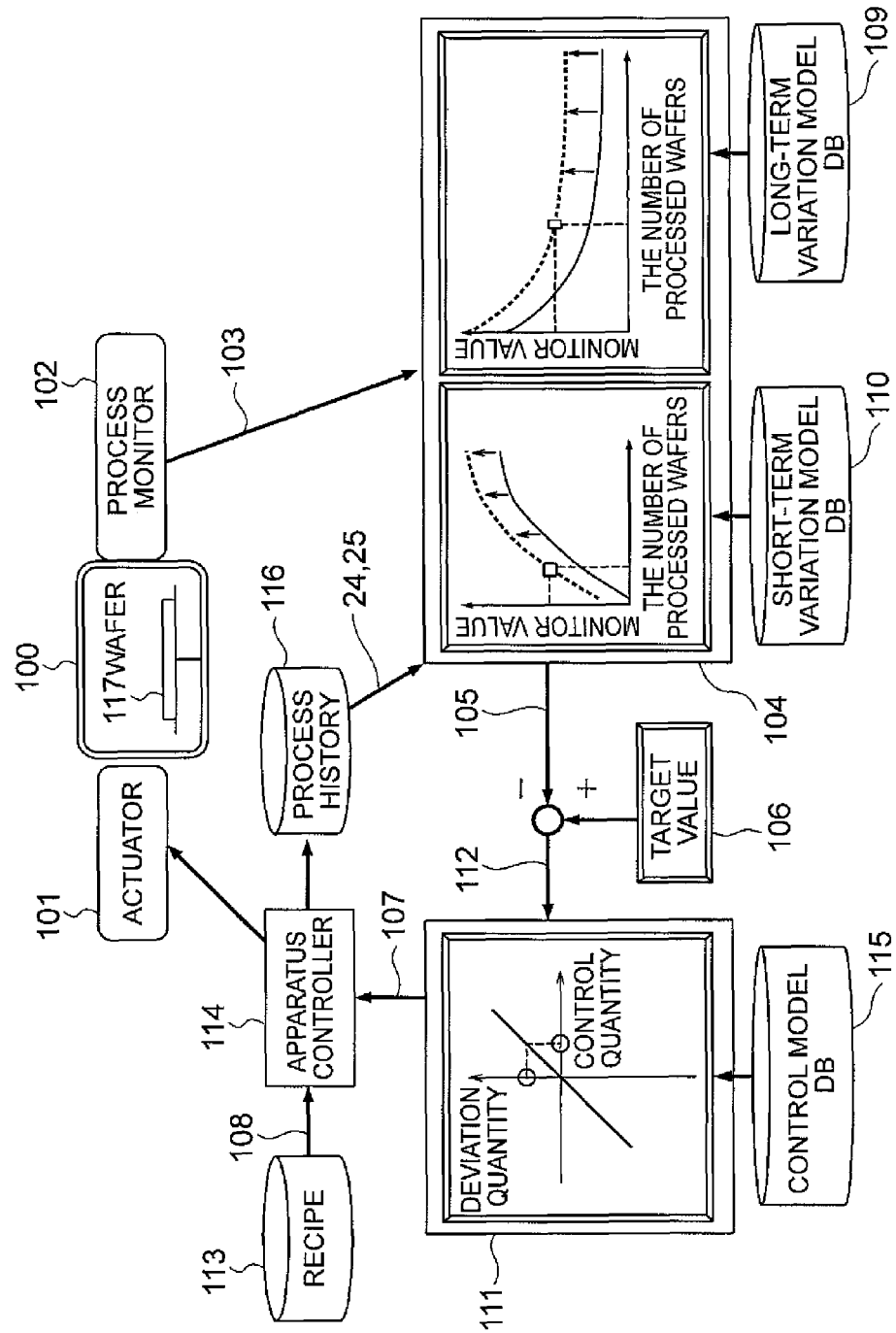
FIG. 1 is a diagram for explaining a plasma processing apparatus according to an embodiment of the invention.
Figure 2:
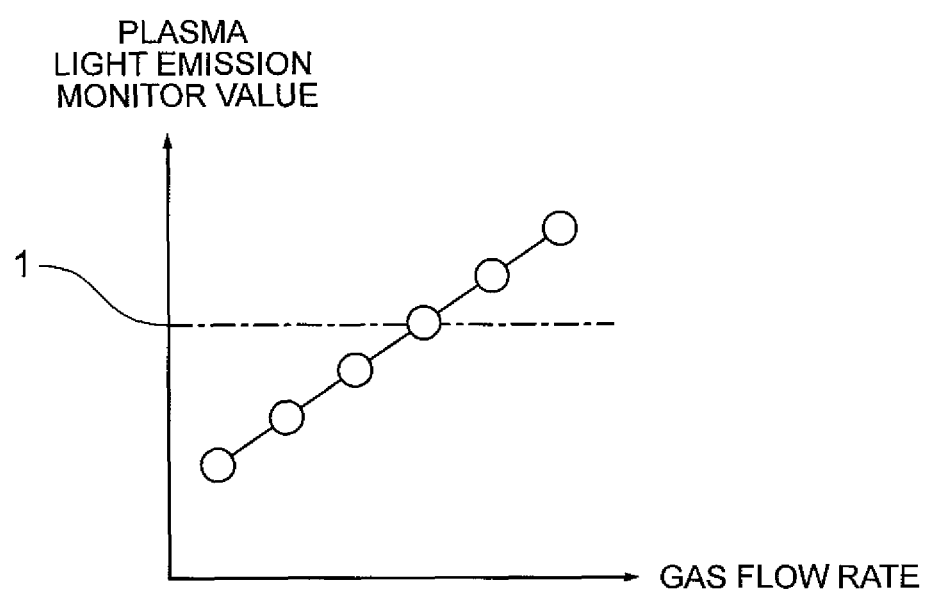
FIG. 2 is a graph of a control model generated by modeling the relation between plasma light emission and a gas flow rate as a process condition.
Figure 3:
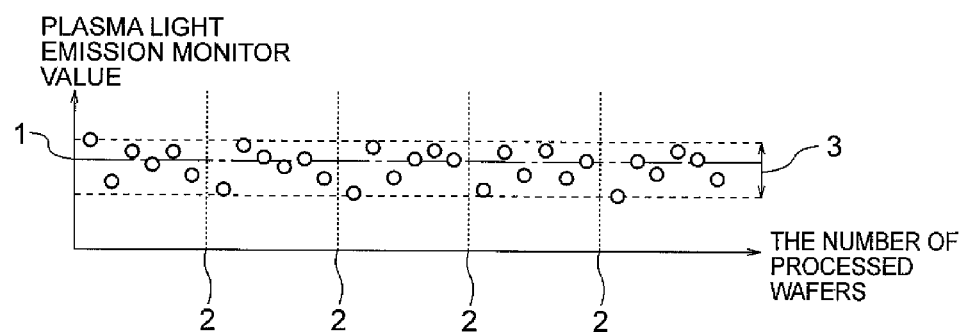
FIG. 3 is a graph showing plasma light emission intensity at run-to-run control.

FIG. 1 is a diagram showing a plasma processing apparatus according to an embodiment of the invention in the case where a plasma etching apparatus is used as an example of the plasma processing apparatus.

A wafer 117 as a subject of an etching process is conveyed to the process chamber 100 and subjected to a plasma etching process. The etching process is executed while an apparatus controller 114 controls an actuator 101 in accordance with a production condition called recipe. The actuator 101 controls a power supply, a pressure control device, a mass-flow controller, etc.

A process monitor 102 monitors the state of the process chamber 100 during the etching process. For example, an emission spectrometer for spectroscopically monitoring plasma light emission during the etching process is used as the process monitor 102.

A monitor value estimation unit 104 has a long-term variation model database 109 and a short-term variation model database 110. Variation models to be processed by the apparatus are stored in the databases respectively in accordance with each recipe or each recipe group. Incidentally, each recipe group is a set of recipes to which one and the same variation model can be applied. Further, past information of wafers processed in the process chamber 100, such as the number 24 of processed wafers from wet cleaning, the number 25 of processed wafers from the top of each lot, etc. can be acquired from a process history management portion 116. Incidentally, the number 25 of processed wafers from the tap of each lot is provided as the number of wafers processed in each process chamber. When, for example, a lot of 25 product wafers are processed separately in two process chambers, 13 wafers ford one lot in one process chamber and 12 wafers form one lot in the other process chamber in terms of the number 25 of processed wafers.

The monitor value estimation unit 104 calculates an estimated monitor value 105 for a next process without execution of run-to-run control, by using these pieces of information and the measured monitor value 103.

The estimated monitor value 105 for the next process without execution of run-to-run control, which value is calculated by the monitor value estimation unit 104, is compared with a target value 106 of the process monitor value, so that a deviation 112 of the estimated monitor value 105 from the target value 106 is calculated. Incidentally, the target value 106 is a value which has been set in advance in accordance with each recipe or each recipe group.

A control quantity calculation unit 111 has a control model database 115. Control models to be processed by the apparatus are stored in the database 115 in accordance with recipes or recipe groups. The control quantity calculation unit 111 calculates a control quantity 107 for a next process based on a control model selected from the control model database 115 and the deviation 112.

Figure 6:
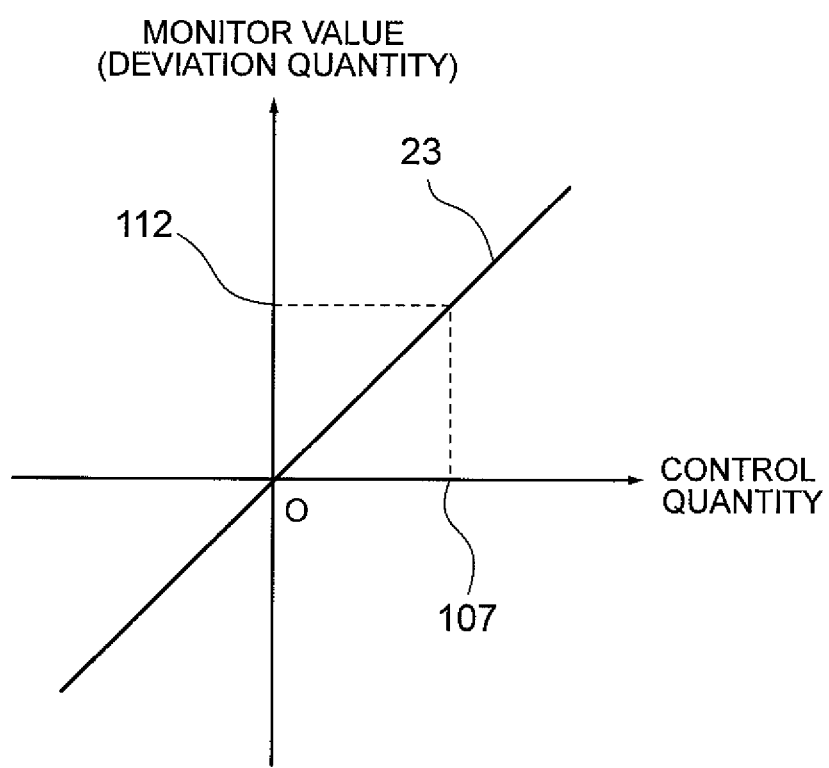
FIG. 6 is a graph for explaining a method of calculating a control quantity for a next process.

FIG. 6 is a graph for explaining a method of calculating the control quantity for the next process. When a point at which the calculated deviation 112 is drawn on the control model 23 can be found in FIG. 6, the control quantity 107 for the next process can be calculated. Incidentally, the control quantity 107 is a value indicating a change quantity with respect to each recipe. In run-to-run control according to the invention, the process is executed while a part of conditions constituting the recipe are changed based on the calculated deviation 112 but the other part of the conditions are left untouched as shown in the recipe.

The apparatus controller 114 shown in FIG. 1 has recipes 113 which are process conditions in accordance with products or product groups to be processed in the process chamber 100. The apparatus controller 114 controls actuators 101 of the apparatus in accordance with the recipes 113 to execute processes in accordance with the process conditions respectively. When each process is executed, the process history is updated.

On this occasion, each control target item of a recipe 108 is increased or decreased by the next process control quantity 107 calculated by the control quantity calculation unit 111. One recipe is generally composed of a plurality of items but a part of the items are changed based on the control quantity 107.

The plasma processing apparatus according to this embodiment repeats the aforementioned processing in accordance with each wafer process.

Incidentally, run-to-run control can be applied not only to a recipe for product wafers but also to a recipe for a plasma cleaning process executed between product wafer processes. For example, the invention can be applied to run-to-run control for such cleaning processes that a recipe for a current cleaning process is changed to another recipe for a next cleaning process. The invention can be further applied to such run-to-run control that a result (monitor value) of each cleaning process is reflected on a product process or vice versa.

Figure 7:
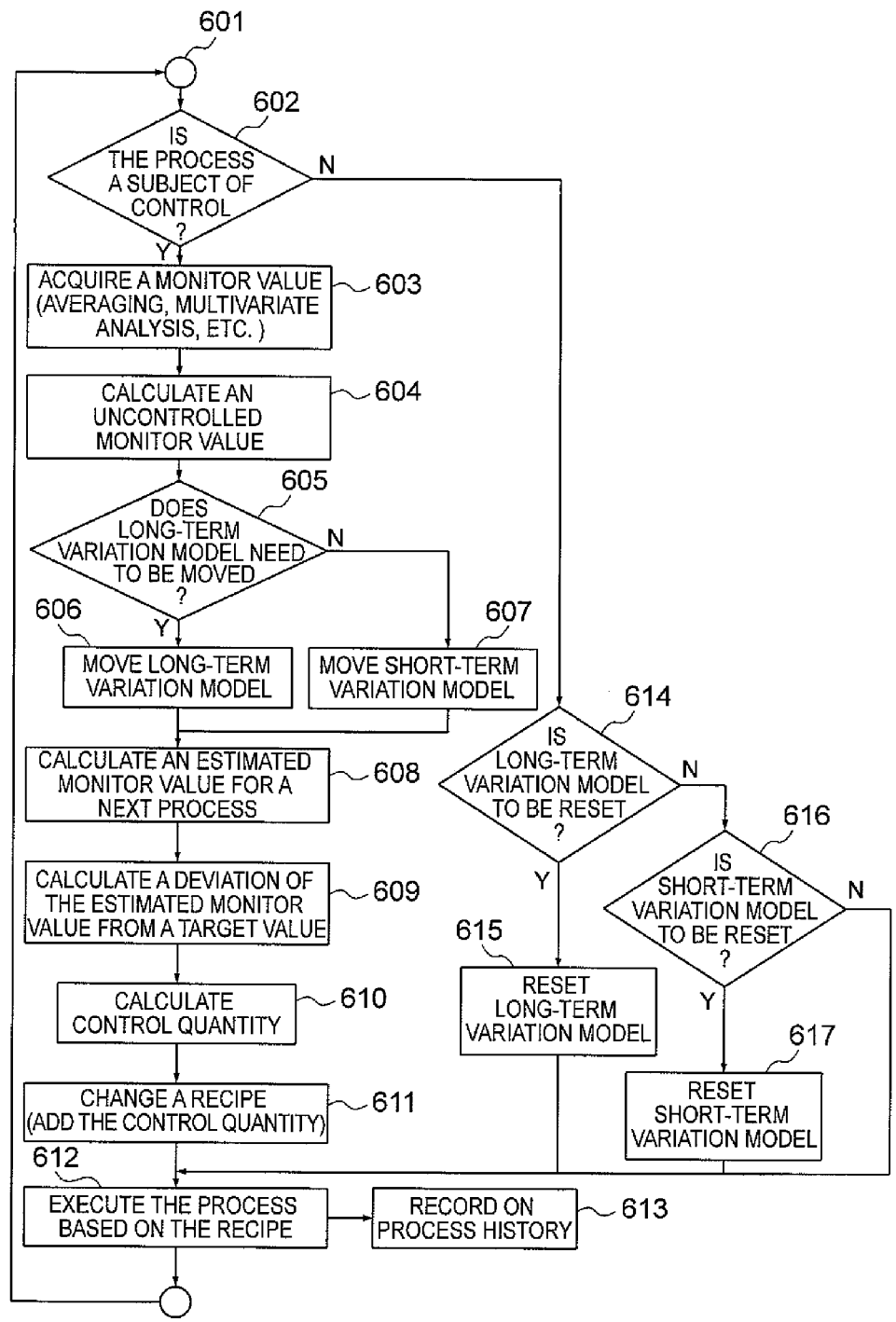
FIG. 7 is a flow chart showing a control flow of run-to-run control.

FIG. 7 is a flow chart showing a control flow of run-to-run control. A control flow start point 601 is just before start of a product process after completion of wet cleaning of the process chamber.

In step 602, determination is made as to whether the process is a subject of run-to-run control or not. For example, a process called aging may be applied at the top of each lot and a cleaning process may be applied between product wafers when a product lot (of 25 product wafers) is to be processed. If only product wafers are intended for run-to-run control in this case, aging and cleaning are not intended for run-to-run control. Incidentally, the cleaning process may be intended for run-to-run control.

In step 603, a process monitor value obtained during the process is acquired. The acquired monitor value is the latest value processed in the past based on the same recipe or recipe group as in the next process. On this occasion, the monitor value may be calculated by averaging or statistical processing in accordance with each process processing time or each step or may be calculated by multivariate analysis such as principal component analysis.

In step 604, an uncontrolled monitor value is calculated based on the acquired monitor value. As for a calculation method, a control quantity on the occasion that the acquired monitor value was processed and a control model used on this occasion are used for calculating back to a monitor quantity (deviation) changed by control. Then, a difference between the acquired monitor value and the calculated-back monitor quantity (deviation) is calculated as an uncontrolled monitor value.

In step 605, determination is made as to whether a long-term variation model to be used for later calculation needs to be moved or not, or whether a short-term variation model to be used for later calculation needs to be moved or not. For example, a long-term variation model is moved for processing of the first wafer in a product lot or processing just after aging, but a short-term variation model is moved for processing of the second wafer or each wafer after the second wafer in the product lot or processing just after plasma cleaning between products. In step 606 or 607, the long-term variation model or the short-term variation model is moved.

Figure 8:
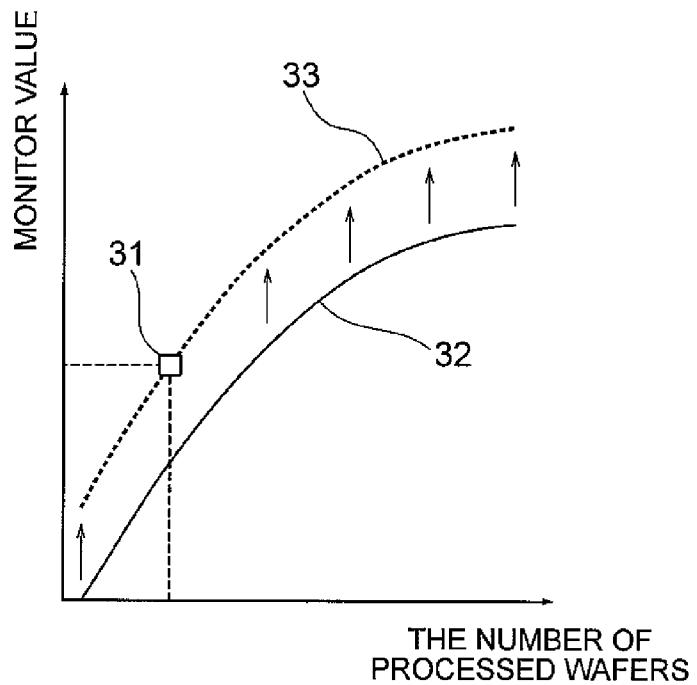
FIG. 8 is a graph for explaining a method of moving a variation model.

FIG. 8 is a graph for explaining a method of moving a variation model (short-term variation model).

First, when the uncontrolled monitor value obtained in the step 604 is plotted, a point 31 is obtained as shown in FIG. 8. As for a model moving method, a short-term variation model 32 before movement is moved in parallel so as to be put on the uncontrolled monitor value 31 to thereby form a moved short-term variation model 33. For example, the short-term variation model represented by the expression 2 can be moved in parallel when the value of $C_2$ is changed so that the moved short-term variation model passes through the uncontrolled monitor value 31.

Figure 9:
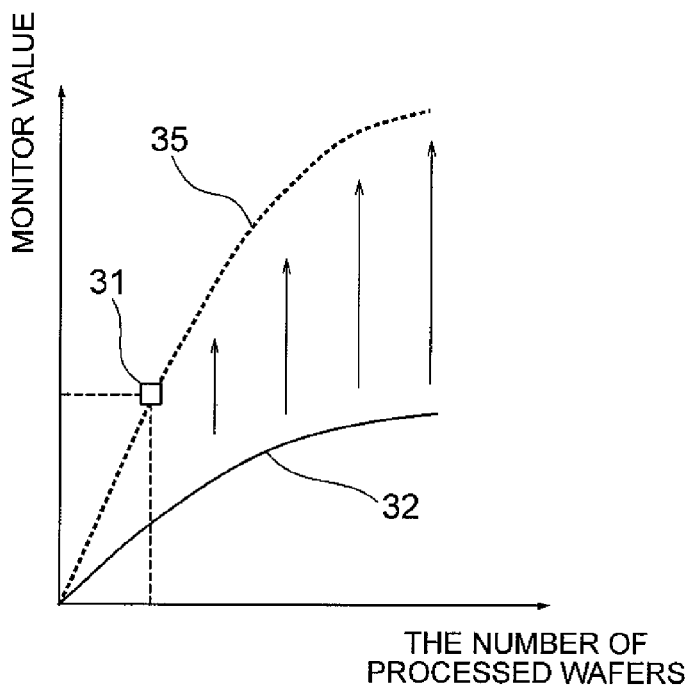
FIG. 9 is a graph for explaining a method of generating a moved short-term variation model.

Alternatively, as shown in FIG. 9, the coefficients $A_2$ and $B_2$ in the expression 2 may be changed to generate a moved short-term variation model 35. A method according to process variation as a subject of control can be selected as the model moving method. Although the method of moving a short-term variation model has been described here, the method of moving a long-term variation model can be performed in the same manner as described above.

In step 608, an estimated monitor value for a next process is calculated. This value is a value estimated based on the long-term variation model and the short-term variation model when control is not performed (the recipe is not changed) in the next process.

Figure 10:
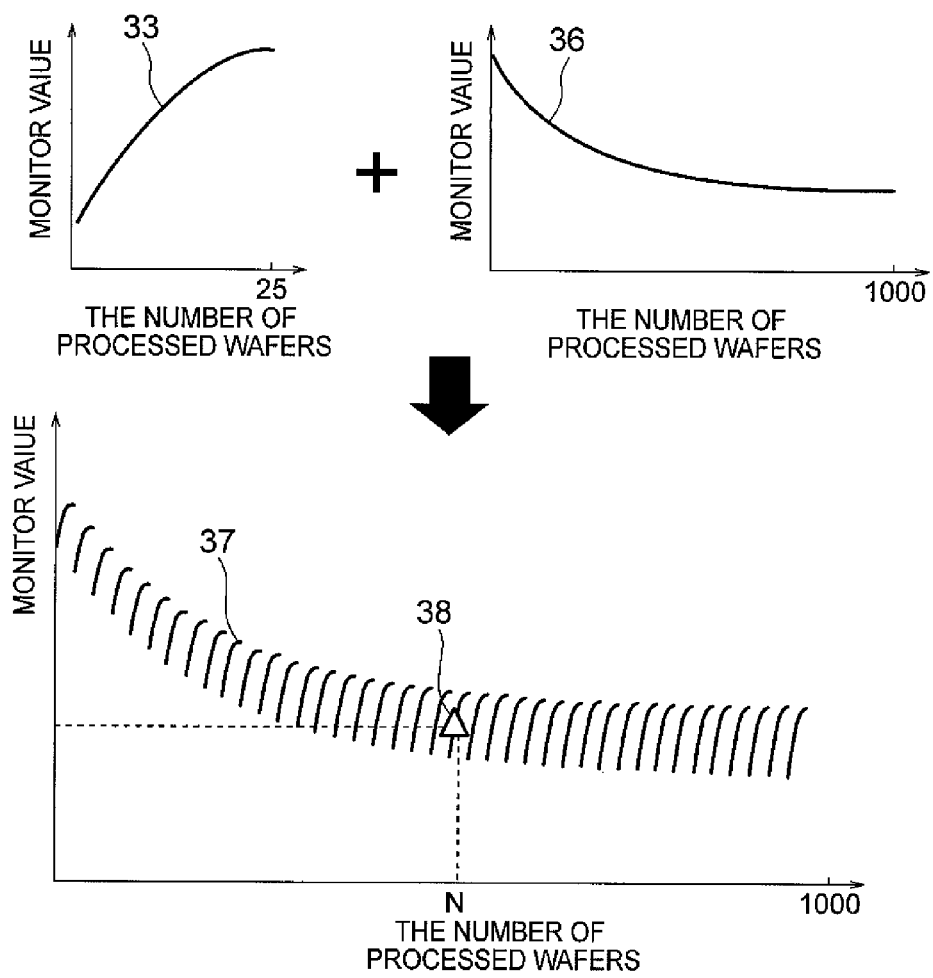
FIG. 10 is a series of graphs for explaining a method of calculating an estimated monitor value for a next process based on the long-term variation model and the short-term variation model.

FIG. 10 is a series of graphs for explaining a method of calculating an estimated monitor value for a next process based on the long-term variation model and the short-term variation model.

First, a composite model 37 is obtained based on the short-term variation model 33 and the long-term variation model 36. The short-term variation model and the long-term variation model used on this occasion are models moved in the steps 606 and 607. Then, a value 38 according to the number N of processed wafers in the next process is calculated on the composite model 37. This value 38 is used as an estimated monitor value for the next process.

In step 609, a deviation of the estimated monitor value calculated in the step 608 from a target value set in accordance with each recipe or each recipe group is calculated. That is, control will be made in the next process so that the deviation can be adjusted in accordance with the target value.

In step 610, a control quantity is calculated based on the deviation calculated in the step 609 and the control model. A method of calculating the control quantity will be described with reference to FIG. 6. The control model 23 is a function expressing the relation between the control quantity and the monitor value. The control quantity is a value of increment or decrement relative to the recipe. The monitor value is a quantity of change of a monitor value when the recipe is changed by the control quantity. Accordingly, the monitor value can be controlled by the deviation from the target value when a control quantity 107 according to the deviation 112 is calculated on the control model 23. That is, the control quantity 107 is used as a control quantity for the next process. On this occasion, the control quantity is a quantity by which the value of at least one item in process conditions in the recipe is changed with use of a predetermined value as a reference value. The process conditions in the recipe are flow rate according to each kind of gas, electric power, pressure, etc.

In step 611, the control quantity calculated in the previous step is added to the recipe for the next process to thereby generate process conditions used in the next process.

In step 612, the process is executed based on the recipe to which the control quantity has been added in the step 611.

In step 613, a process history for the process in the step 612 indicating the number of processed wafers from wet cleaning executed on the process chamber opened to the atmospheric air, the number of processed wafers from an aging process executed at the top of each lot, etc. is recorded.

In step 614 or 616, determination is made as to whether the variation model is to be reset or not, after determination in the step 602 results in that the process is not a subject of control. For example, in the case of the long-term variation model, the model is reset when the process chamber is just after execution of wet cleaning (step 615). On the other hand, in the case of the short-term variation model, the model is reset just after separation of a product lot, that is, execution of an aging process (step 617).

Each model is reset is as follows. In the example of the long-term variation model represented by the expression 1, the variable $N_1$ is reset to 1 (or 0). In the example of the short-term variation model represented by the expression 2, the variable $N_2$ is reset to 1 (or 0). Incidentally, the condition for resetting each model can be set in any other event than the aforementioned events and there may be the case where each model is not reset in some event.

Although the flow shown in FIG. 7 has been described in the case where products in the same recipe or the same recipe group are processed repeatedly, the flow may be adapted, for example, to processing of kinds of products in such a manner that the method of moving the long-term variation model or the short-term variation model is adjusted in accordance with each product kind.

Although the flow shown in FIG. 7 has been described in the case where only the latest value in the past is acquired as the monitor value, it may be conceived that past monitor values are acquired and the long-term variation model or the short-term variation model is updated in accordance with the tendency of change of the monitor values.

FIGS. 11A and 11B are views for explaining the form of run-to-run control. Description will be made while a plasma etching apparatus is taken as an example.

An etching process in semiconductor production generally has process units called steps. Process conditions such as gas flow rate, pressure, electric power, etc. are defined in accordance with the process units respectively. One recipe is composed of a set of the conditions according to the steps.

FIG. 11A shows an example of run-to-run control in the case where one step is monitored.

As shown in FIG. 11A, plasma light emission 150 during processing in step 2 of a process N is measured by a spectroscope 151. For example, statistical processing is applied to the measured data to form a process monitor value 152. The reference numeral 153 designates a combination of the monitor value estimation unit 104 and the control quantity calculation unit 111 shown in FIG. 1. The control quantity calculated by the unit combination 153 is allocated to corresponding recipe items of steps 2 and 3 as subjects of control. The control quantity may be allocated equally or may be multiplied by specific coefficients so as to increase or decrease.

FIG. 11B shows an example of run-to-run control in the case where a plurality of steps are monitored.

Plasma light emission 170 during processing in step 2 of a process N is measured by a spectroscope 171. For example, statistical processing is applied to the measured data to form a process monitor value 172. The reference numeral 173 designates a combination of the monitor value estimation unit 104 and the control quantity calculation unit 111 shown in FIG. 1. The control quantity calculated by the unit combination 173 is allocated to corresponding recipe items of steps 2 and 3 as subjects of control. The control quantity may be allocated equally or may be multiplied by specific coefficients so as to increase or decrease.

Plasma light emission 176 during processing in step 4 of the process N is further measured by a spectroscope 171. For example, statistical processing is applied to the measured data to form a process monitor value 177. The reference numeral 178 designates a combination of the monitor value estimation unit 104 and the control quantity calculation unit 111 shown in FIG. 1. The control quantity calculated by the unit combination 178 is allocated to corresponding recipe items of steps 4 and 5 as subjects of control. The control quantity may be allocated equally or may be multiplied by specific coefficients so as to increase or decrease.

As described above, control logics each for monitoring one step can be combined for monitoring a plurality of steps.

FIGS. 12A to 12D are views showing examples as to how the form of a control method changes in accordance with a subject of monitor and a subject of control when run-to-run control is executed.

In FIGS. 12A to 12D, "Aging" designates an aging process performed at the time of start of a lot, "CL" designates a plasma cleaning process performed before a product process, "Product" designates the product process, and the arrangement thereof designates a processing sequence.

Figure 12A:
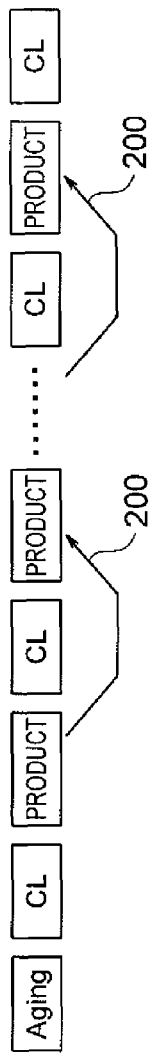
FIGS. 12A to 12D are views showing examples as to how the form of a control method changes in accordance with a subject of monitor and a subject of control when run-to-run control is executed.

FIG. 12A shows a control form in the case where both a subject of monitor and a subject of control are product processes. In FIG. 12A, the reference numeral 200 means that a monitored result of a product process is used for controlling a next product process. Incidentally, a cleaning process (CL in FIG. 12A) may be provided between product processes as shown in FIG. 12A but control of only product processes is executed even in this case.

Figure 12B:
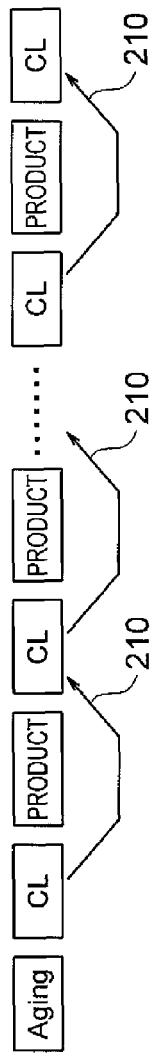

FIG. 12B shows a control form in the case where both a subject of monitor and a subject of control are cleaning processes (CL in FIG. 12B). In FIG. 12B, the reference numeral 210 means that a monitored result of a cleaning process is used for controlling a next cleaning process.

Figure 12C:
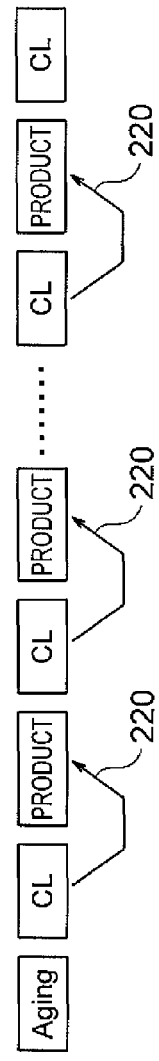

FIG. 12C shows a control form in the case where a subject of monitor is a cleaning process and a subject of control is a product process. In FIG. 12C, the reference numeral 220 means that a monitored result of a cleaning process is used for controlling a next product process.

Figure 12D:
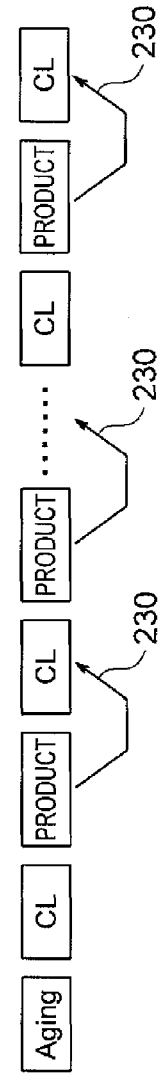

FIG. 12D shows a control form in the case where a subject of monitor is a product process and a subject of control is a cleaning process. In FIG. 12D, the reference numeral 230 means that a monitored result of a product process is used for controlling a next cleaning process.

Figure 13:
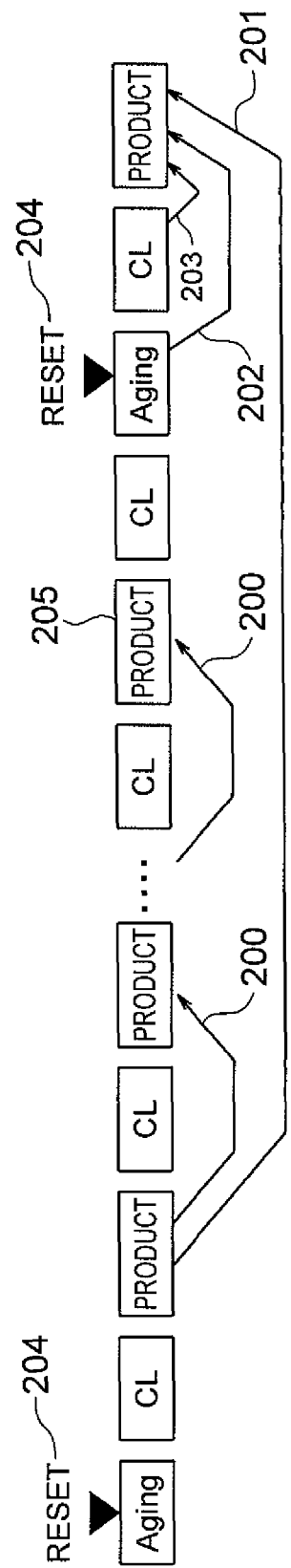
FIG. 13 is a view showing an example of a control form in the case where change of a lot exists in the control form shown in each of FIGS. 12A to 12D.

FIG. 13 is a view showing an example of a control form in the case where change of a lot, that is, a short-term variation model exists in the control form described with reference to each of FIGS. 12A to 12D. FIG. 13 shows the case where run-to-run control is executed in the condition that both a subject of monitor and a subject of control are product processes like FIG. 12A. A short-term variation model is reset at change of a lot to thereby exhibit short-term variation in the lot. In FIG. 13, the reference numeral 204 designates a time for resetting the model. In FIG. 13, the reset 204 is synchronized with an aging process executed at the top of each lot. When there is an event of the reset 204, a monitored result of a product process (205 in FIG. 13) just before the reset is not used but a monitored result (201 in FIG. 13) of a product process just after the reset in the previous lot, a monitored result (202 in FIG. 13) of an aging process (Aging in FIG. 13) or a monitored result (203 in FIG. 13) of a cleaning process (CL in FIG. 13) between product processes is used for controlling a next product process. Incidentally, this resetting method can be applied to the other control forms shown in FIGS. 12B to 12D.

As described above, in accordance with this embodiment, in such run-to-run control that process conditions are changed according to each wafer process, a process model indicating long-term or short-term variation of the state of a process processing apparatus is applied to a control loop, so that a stable processed result can be obtained even when process variation such as variation in a lot or variation between lots exists.

What is claimed is:

1. A plasma processing apparatus for applying plasma processing by run-to-run control to specimens that are disposed in a vacuum processing chamber by using plasma generated in the vacuum processing chamber, comprising:

a first database that stores a first monitor value variation model indicating a correlation between a number of specimens processed during a period from execution of wet cleaning to execution of a next process and a monitor value of a process quantity obtained when specimens of this number have been processed;

a second database that stores a second monitor value variation model indicating a correlation between a number of specimens processed during a period from start of a lot process to end of the lot process and a monitor value of a process quantity obtained when specimens of this number have been processed;

a process history management unit that stores the number of specimens processed from execution of wet cleaning to execution of a next process and the number of specimens processed from start of a lot process to end of the lot process;

a monitor value estimation unit configured to obtain a composite model of the first monitor value variation model and the second monitor value variation model and configured to calculate a monitor value for a next process based on the composite model;

a third database that stores a control model indicating a correlation between a control quantity for controlling a process quantity of the vacuum processing chamber and a quantity of change of a monitor value; and a control quantity calculation unit configured to calculate a control quantity for the next process which corresponds to a deviation of the monitor value calculated by the monitor value estimation unit and a target value based on the control model;

wherein the monitor value estimation unit comprises a monitor value variation model movement unit configured to move the first monitor value variation model for processing just after aging;

wherein the first monitor value variation model is a function of processed wafers from wet cleaning, and at least one long term variation model coefficient;

wherein the second monitor variation model is a function of the number of processed wafers in a lot and at least one short-term model coefficient.

2. The plasma processing apparatus according to claim 1, wherein the first monitor quantity variation model is reset whenever wet cleaning is performed.

3. The plasma processing apparatus according to claim 1, wherein the next process is a same product process or cleaning process as a current process.

4. The plasma processing apparatus according to claim 1, wherein a current process is a product process and the next process is a cleaning process.

5. The plasma processing apparatus according to claim 1, wherein a current process is a cleaning process and the next process is a product process.

6. The plasma processing apparatus according to claim 1, wherein the first monitor quantity variation model is represented by the expression:

$$Y_1 = A_1 \times B_1^{(N_1+C_1)} + D_1$$

in which $Y_1$ is a process monitor value, which is a plasma light emission monitor value, $N_1$ is a number of processed wafers from wet cleaning, and $A_1$, $B_1$, $C_1$ and $D_1$ are long-term variation model coefficients.

7. The plasma processing apparatus according to claim 1, wherein the second monitor quantity variation model is represented by the expression:

$$Y_2 = A_2 \times N_2^2 + B_2 \times N_2 + C_2$$

in which $Y_2$ is a process monitor value, which is a plasma light emission monitor value, $N_2$ is a number of processed wafers in a lot, and $A_2$, $B_2$ and $C_2$ are short-term variation model coefficients.

8. A plasma processing apparatus for applying plasma processing by run-to-run control to specimens that are disposed in a vacuum processing chamber by using plasma generated in the vacuum processing chamber, comprising:

a first database that stores a first monitor value variation model indicating a correlation between a number of specimens processed during a period from execution of wet cleaning to execution of a next process and a monitor value of a process quantity obtained when specimens of this number have been processed;

a second database that stores a second monitor value variation model indicating a correlation between a number of specimens processed during a period from start of a lot process to end of the lot process and a monitor value of a process quantity obtained when specimens of this number have been processed;

a process history management unit that stores the number of specimens processed from execution of wet cleaning to execution of a next process and the number of specimens processed from start of a lot process to end of the lot process;

a monitor value estimation unit configured to obtain a composite model of the first monitor value variation model and the second monitor value variation model and configured to calculate a monitor value for a next process based on the composite model;

a third database that stores a control model indicating a correlation between a control quantity for controlling a process quantity of the vacuum processing chamber and a quantity of change of a monitor value; and a control quantity calculation unit configured to calculate a control quantity for the next process which corresponds to a deviation of the monitor value calculated by the monitor value estimation unit and a target value based on the control model;

wherein the monitor value estimation unit comprises a monitor value variation model movement unit configured to move the first monitor value variation model or the second monitor value variation model so as to be put on a monitor value for a current process without execution of run-to-run control;

wherein the first monitor value variation model is a function of processed wafers from wet cleaning and at least one long term variation model coefficient;

wherein the second monitor variation model is a function of the number of processed wafers in a lot and at least one short-term model coefficient.

9. A plasma processing apparatus for applying plasma processing by run-to-run control to specimens that are disposed in a vacuum processing chamber by using plasma generated in the vacuum processing chamber, comprising:

a first database that stores a first monitor value variation model indicating a correlation between a number of specimens processed during a period from execution of wet cleaning to execution of a next process and a monitor value of a process quantity obtained when specimens of this number have been processed;

a second database that stores a second monitor value variation model indicating a correlation between a number of specimens processed during a period from start of a lot process to end of the lot process and a monitor value of a process quantity obtained when specimens of this number have been processed;

a process history management unit that stores the number of specimens processed from execution of wet cleaning to execution of a next process and the number of specimens processed from start of a lot process to end of the lot process;

a monitor value estimation unit configured to obtain a composite model of the first monitor value variation model and the second monitor value variation model and configured to calculate a monitor value for a next process based on the composite model;

a third database that stores a control model indicating a correlation between a control quantity for controlling a process quantity of the vacuum processing chamber and a quantity of change of a monitor value; and a control quantity calculation unit configured to calculate a control quantity for the next process which corresponds to a deviation of the monitor value calculated by the monitor value estimation unit and a target value based on the control model;

wherein the monitor value estimation unit comprises a monitor value variation model movement unit configured to move the second monitor value variation model in parallel so as to be put on a monitor value for a current process without execution of run-to-run control;

wherein the first monitor value variation model is a function of processed wafers from wet cleaning and at least one long term variation model coefficient;

wherein the second monitor variation model is a function of the number of processed wafers in a lot and at least one short-term model coefficient.

* * * * *